(12) United States Patent
Horng et al.

(10) Patent No.: US 8,849,599 B2
(45) Date of Patent: Sep. 30, 2014

(54) METHOD FOR PARAMETERS EXTRACTION OF SOLAR CELLS

(75) Inventors: Sheng-Fu Horng, Hsinchu (TW);
Ming-Kun Lee, Hsinchu (TW);
Jen-Chung Wang, Hsinchu (TW);
Hsin-Fei Meng, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 688 days.

(21) Appl. No.: 13/166,348

(22) Filed: Jun. 22, 2011

(65) Prior Publication Data
US 2011/0320145 A1 Dec. 29, 2011

(30) Foreign Application Priority Data
Jun. 23, 2010 (TW) .............................. 99120405 A

(51) Int. Cl.
*G01R 27/08* (2006.01)
*G06F 17/40* (2006.01)
*G06F 19/00* (2011.01)
*G01R 31/26* (2014.01)

(52) U.S. Cl.
CPC ............ *G01R 31/2605* (2013.01); *G06F 17/40* (2013.01); *G01R 27/08* (2013.01); *G06F 19/00* (2013.01)
USPC ............ 702/65; 73/865.8; 250/200; 324/600; 702/64; 702/127; 702/187; 702/189

(58) Field of Classification Search
CPC ........... G01D 7/00; G01D 9/00; G01D 21/00; G01R 27/00; G01R 27/02; G01R 27/08; G01R 31/00; G01R 31/26; G06F 11/00; G06F 11/30; G06F 11/32; G06F 11/34; G06F 17/00; G06F 17/40; G06F 19/00
USPC ............ 73/1.01, 1.88, 865.8, 865.9; 250/200, 250/252.1; 324/600, 601, 612, 619; 702/1, 702/57, 64, 65, 127, 187, 189
See application file for complete search history.

(56) References Cited

U.S. PATENT DOCUMENTS

| | | | | | |
|---|---|---|---|---|---|
| 2,554,225 | A | * | 5/1951 | Taylor | 250/252.1 |
| 2,733,405 | A | * | 1/1956 | Gerber | 324/727 |
| 6,541,754 | B2 | * | 4/2003 | Matsuyama | 250/214.1 |
| 6,876,187 | B2 | * | 4/2005 | Matsuyama | 324/96 |
| 7,309,850 | B2 | * | 12/2007 | Sinton et al. | 250/203.4 |
| 7,696,461 | B2 | * | 4/2010 | Sinton et al. | 250/203.4 |
| 8,224,598 | B2 | * | 7/2012 | Wu et al. | 702/64 |
| 2002/0014886 | A1 | * | 2/2002 | Matsuyama | 324/96 |
| 2002/0030153 | A1 | * | 3/2002 | Matsuyama | 250/214.1 |
| 2007/0029468 | A1 | * | 2/2007 | Sinton et al. | 250/214 R |
| 2008/0246463 | A1 | * | 10/2008 | Sinton et al. | 324/157 |
| 2009/0234601 | A1 | * | 9/2009 | Wu et al. | 702/64 |

* cited by examiner

*Primary Examiner* — Edward Cosimano
(74) *Attorney, Agent, or Firm* — WPAT, P.C.; Anthony King

(57) ABSTRACT

The present invention discloses a method for extracting of solar cell parameters. After illuminating the solar cell by different simulated solar luminosity with different illumination intensity, measured current and measured voltages of the solar cell are acquired and the series resistance of the solar cell is extracted based on the measured current and measured voltages. The root mean square error (RMSE) is used to determine the series resistance of the solar cell. Therefore, the parameters of the solar cell are extracted without presuming current-voltage functional form.

10 Claims, 5 Drawing Sheets

METHOD FOR PARAMETERS EXTRACTION OF SOLAR CELLS

BACKGROUND OF THE INVENTION

1. Field of the Invention

This invention relates to a solar cell; more particularly, a method for extracting solar cell parameters which can gain the series resistance of the solar cell through calculation without presuming current-voltage functional form.

2. Description of the Prior Art

As known, with the drying out of oil resource and the awareness of environment protection, the discovery of alternative resources is gradually more emphasized by many countries. In which, due to the inexhaustible characteristic of solar energy, the discovery of solar energy has gotten more attention; therefore, many countries have tried to discover and establish the application techniques of solar energy, in order to reduce the dependence on the petrochemical energy through the exploitation of solar energy. As a result, the trend of the development has resulted in the manufacture of solar cell.

FIG. 1 illustrates the ideal equivalent circuit of a solar cell. FIG. 2 illustrates the actual equivalent circuit of a solar cell. As illustrated by the figures, the value of the shunt resistance (Rsh) should be indefinite, and the value of the series resistance (Rs) is infinite small, that is the shunt resistance (Rsh) and the series resistance (Rs) do not exist in the solar cell equivalent circuit in the ideal situation. Like all the other generators containing intrinsic series resistance, both the series resistance and the shunt resistance in a solar cell exist and they would significantly affect the power conversion efficiency (PCE). Moreover, the design and simulation of solar cell systems also require an accurate knowledge of the series resistance and other related device parameters to describe their nonlinear electrical behavior. Therefore, extracting the series resistance and other device parameters for solar cells is very importance.

Over the years, various methods have been proposed for extracting the series resistance and related device parameters of solar cells. These methods either involve current-voltage (I-V) measurements with different illumination levels, or employ integration procedures based on the computation of the area under the linear regression, etc. Currently, all these previously proposed methods of extracting the series resistance and related device parameters of solar cells are mostly based on the assumption of the intrinsic I-V relationship of the solar cell, that is the Shockley-type single exponential I-V characteristic with ideality factor. Although the exponential I-V assumption may produce equivalent-circuit model quickly and easily, and it can be used in conventional simulation tools; however, it can not be used in all solar cells, such as non p-n junction type devices or organic solar cell (OSC), etc. As a result, using Shockley-type single exponential I-V characteristic with ideality factor to measure the intrinsic I-V relationship and related device parameters of a solar cell is not really practical.

Therefore, how to use a single method to measure the series resistance inside of all kinds of solar cells is in fact a meaningful thinking direction.

BRIEF SUMMARY OF THE INVENTION

Consequently, the purpose of this invention is to provide a method for parameters extraction of solar cells which can measure all kinds of solar cell parameters.

In order to reach the goal stated above, the implementation of the technology of the present invention is described as follows:

A process for parameters extraction of solar cells includes the following steps: (a) apply a first simulated solar luminosity having a first intensity to a solar cell; (b) measure a first current value and a first voltage value generated by the solar cell when the solar cell is illuminated by the first simulated solar luminosity; (c) apply a second simulated solar luminosity having a second intensity to the solar cell; (d) measure a second current value and a second voltage value generated by the solar cell when the solar cell is illuminated by the second simulated solar luminosity; (e) presume a series resistance, use a first calculation process to gain a total resistance, use a second calculation process, the series resistance, the first current value and the first voltage value to gain a first photocurrent value, and the values of a voltage across diode and a diode current can be gained by the first current value and the first voltage value; (f) a second photocurrent value can be gained in accordance with the second calculation process, the series resistance, the second current value and the second voltage value; (g) a voltage value and a current value can be gained in accordance with the series resistance, the total resistance, the second photocurrent value, the value of the voltage across diode and the diode current value; (h) measure a root mean square error (RMSE) between the voltage value and the current value, and the second voltage data and the second current data; (i) if the value of the RMSE is larger than a certain value, then repeat from step (e) to step (h), if it's less than a certain value, then the second series resistance is the series resistance of the solar cell.

Another embodiment of the present invention further includes isolating the solar cell from outside luminosity source before step (a), so as to avoid any possible impact factors when measuring the solar cell.

Another embodiment of the present invention further includes switching off the first simulated solar luminosity after step (b), and the step of switching off the second simulated solar luminosity after step (d), so as to avoid any possible impact factors when measuring the solar cell.

DETAILED DESCRIPTION OF THE PREFERRED EMBODIMENT

Figure 1:
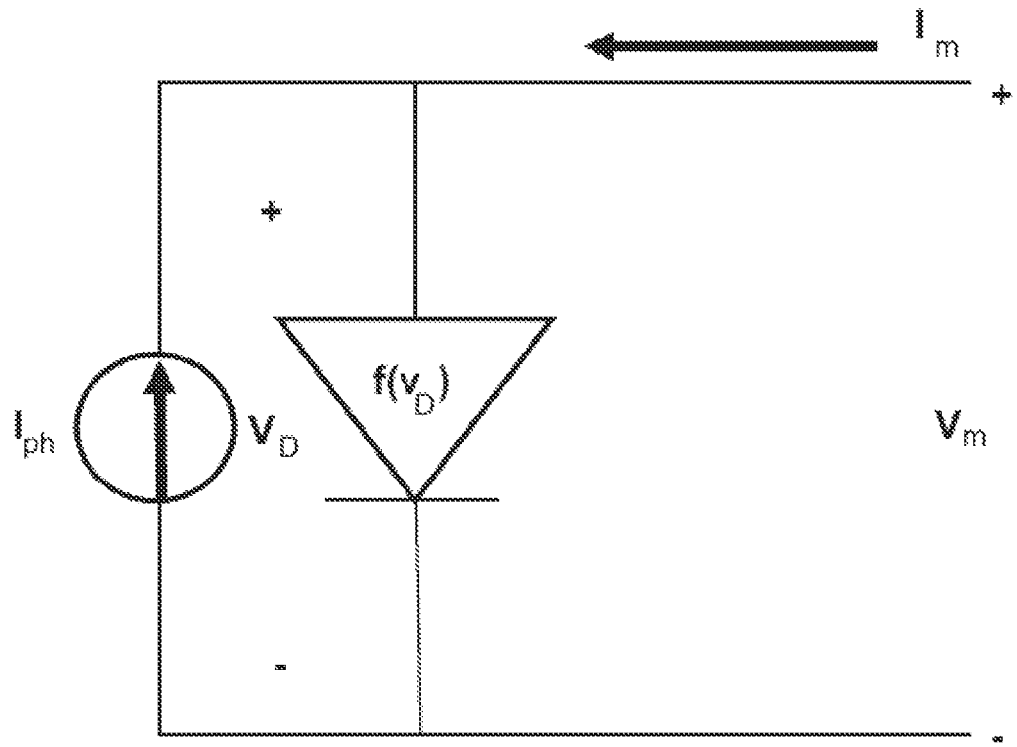
FIG. 1 illustrates the ideal equivalent circuit of a solar cell.
Figure 2:
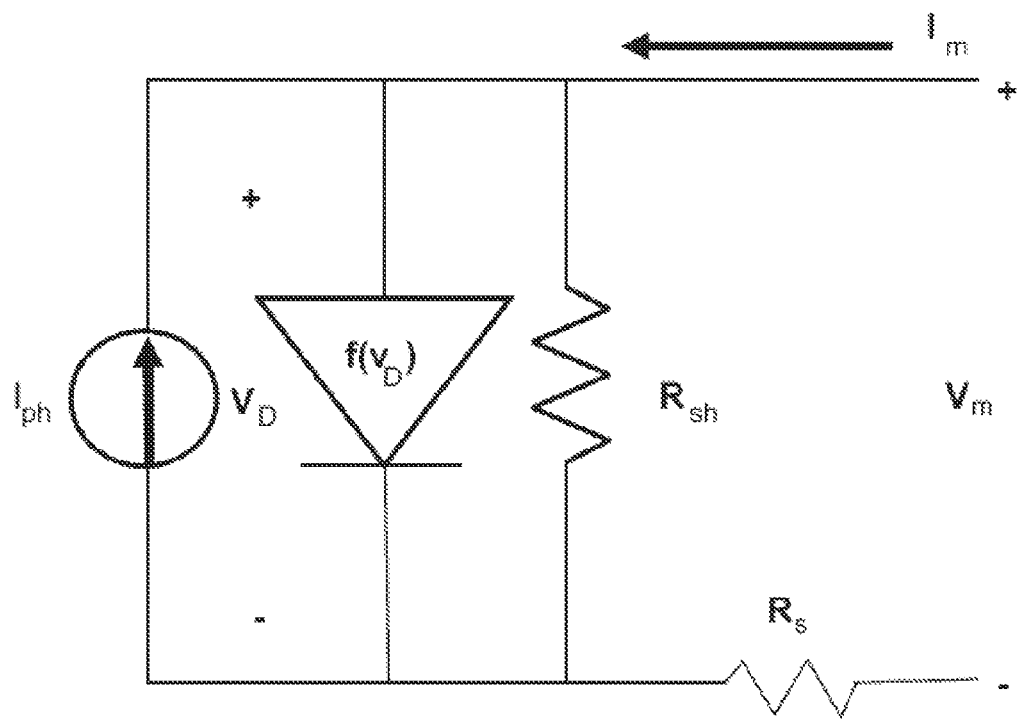
FIG. 2 illustrates the actual equivalent circuit of a solar cell.

The process for extracting of solar cell parameters of the present invention gains the actual series resistance mainly through the actual equivalent circuit figure of FIG. 2, along with Ohm's law, KVL (Kirchhoff's voltage law) and KCL (Kirchhoff's current law). In FIG. 2, $I_m$ is the measured current, $V_D$ is the voltage across the diode, $f(V_D)$ is the current across the diode; that is the current across the diode when the voltage across the diode is VD, the intrinsic current-voltage (I-V) characteristic, $I_{ph}$ is the photocurrent, that is the current generated when the solar cell is illuminated by the simulated solar luminosity, $R_s$ is the series resistance, $R_{sh}$ is the shunt resistance, $V_m$ is the measured voltage. Therefore, the following two equations can be gained:

$$I_m = \frac{V_D}{R_{sh}} + f(V_D) - I_{ph} \qquad (1)$$

$$V_m = V_D + \left[\frac{V_D}{R_{sh}} + f(V_D) \, I_{ph}\right] \cdot R_s \qquad (2)$$

Because the series resistance $R_s$ and the shunt resistance $R_{sh}$ are both constant, under the condition of the simulated solar luminosity with the same intensity, the photocurrent $I_{ph}$, voltage across diode $V_D$ and the current across diode $f(V_D)$ are all constant; hence, under the condition of the simulated solar luminosity with the same intensity, the measured current $I_m$ and the measured voltage $V_m$ of the solar cell are both constant.

Because the equivalent circuit of solar cell is already disclosed in FIG. 2, according to the characteristics of the diode and the solar cell, before the measurement, we can presume that:

I. When the voltage across diode $V_D$ is zero, the current across diode $f(V_D)$ is also zero, at the same time, the power of the solar cell is provided by the photocurrent $I_{ph}$;

II. When the voltage across diode $V_D$ is less than zero, the current across diode $f(V_D)$ is close to a negative value $-f_0$, which is attributed to the leakage current of shunt resistance $R_{sh}$;

III. Photocurrent $I_{ph}$ will change with the differences of the intensity of the simulated solar luminosity.

From presumption (II), it can be predicted that when the voltage across diode $V_D$ is less than zero, the measured voltage $V_D$ is also less than zero. With equations (1) and (2), measured voltage $V_D$ can be removed, and the following equations can be gained:

$$I_m = \frac{1}{(R_{sh} + R_s)} \cdot V_m - \frac{R_{sh}}{(R_{sh} + R_s)} \cdot (f_0 + I_{ph}) \qquad (3)$$

$$I_{ph} = I_m(V_m = R_s \cdot I_m) \qquad (4)$$

The total resistance of solar cell is presumed to be $R_t$, then $R_t = R_s + R_{sh}$. Together with equations (1) and (2), the following equations can be gained:

$$V_D = V_m - R_s \cdot I_m \qquad (5)$$

$$f(V_D) = \frac{R_t}{(R_t - R_s)} \cdot I_m - \frac{V_m}{(R_t - R_s)} + I_{ph} \qquad (6)$$

Moreover, the following equation can be gained from presumption (I):

$$I_{ph} = -I_m(V_m @ V_D = 0) \qquad (7)$$

Figure 3:
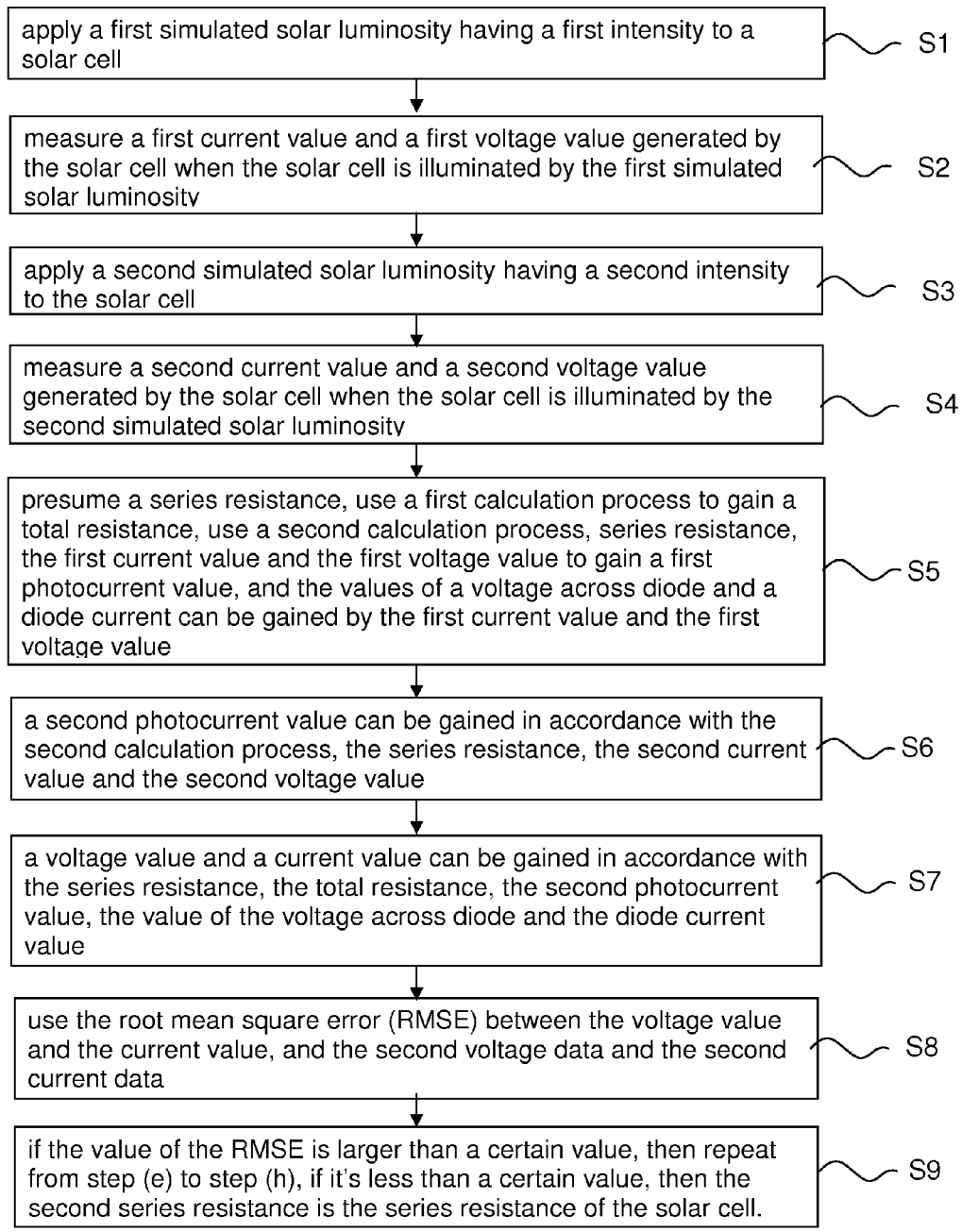
FIG. 3 is the flow chart of the measuring method for the solar cell parameters of this invention.

FIG. 3 is the flow chart of the measuring method of the solar cell of the present invention. As illustrated, if solar cell parameters are to be measured (e.g. series resistance), a solar cell can first be applied a first simulated solar luminosity with the first intensity (step S1). After that, measure a first current value $I_{m1}$ and a first voltage value $V_{m1}$ generated by the solar cell when illuminated by the first simulated solar luminosity (step S2), the first current value is $I_{m1}$. Then, apply the second simulated solar luminosity having the second intensity to the solar cell (step S3), and measure a second current value $I_{m2}$ and a second voltage value $V_{m2}$ generated when the solar cell is illuminated by the second simulated solar luminosity (step S4), and the second current value is $I_{m2}$. In which, the first intensity is different from the second intensity to ensure that the first current value $I_{m1}$ and the second current value $I_{m2}$ are different.

Presume a series resistance $R_s$, and use equation (3) to gain a total resistance $R_t$. With equation (4), series resistance $R_s$, the first current value $I_{m1}$ and the first voltage value $V_{m1}$, a first photocurrent value $I_{ph1}$ can be gained. Insert the five values into equations (3), (5) and (6), a first photocurrent value $I_{ph1}$ can be gained, and insert the five values, the series resistance $R_s$, the total resistance $R_t$, the first photocurrent value $I_{ph1}$, the first current value $I_{m1}$, the first voltage value $V_{m1}$ into equations (3), (5) and (6), a voltage across diode $V_D$ and a current across diode $f(V_D)$ can be gained (step S5). According to equation (4), the series resistance $R_S$, the total resistance $R_t$, the second current value $I_{m2}$ and the second voltage value $V_{m2}$, a second photocurrent value $I_{ph2}$ can be gained (step S6). According to the series resistance $R_s$, the total resistance $R_t$, the second photocurrent value $I_{ph2}$, the voltage across diode $V_D$ and the current value of the diode $f(V_D)$, insert the five values into equations (3), (5) and (6), a voltage value Vmc and a current value $I_{mc}$ can be gained (step S7). Finally, the voltage value $V_{mc}$ and the current value $I_{mc}$ form a value, and the second voltage value $V_{m2}$ and the second current value $I_{m2}$ form another value. Use root mean square error between the two values gained above (step S8), if the value of the RMSE is larger than a certain value, steps S5-S8 are repeated; and if the value of the RMSE is less than a certain value, the second series resistance $R_{s2}$ is the series resistance of the solar cell (step S9). Moreover, the measuring of the intrinsic series resistance value and other parameters is completed. Consequently, the I-V curve of the solar cell of the present invention does not need to be presumed, all parameters of the solar cell can be gained accurately, which is really practical.

Moreover, after the completion of step S2, the step of switching off the first simulated solar luminosity is further included, to avoid any possible impact on the current value and the voltage value when the solar cell is illuminated by the second simulated solar luminosity with the second intensity. Same as above, after the completion of Step S4, the step of switching off the second simulated solar luminosity is further included, to avoid any possible impact on the current value and the voltage value when the solar cell is illuminated by the third simulated solar luminosity.

In the present invention, the first simulated solar luminosity and the second simulated solar luminosity (i.e. all the simulated luminosities with different intensity) is provided by a solar luminosity generating unit. Therefore, during measurement, the user has to control the simulated luminosity manually to change the intensity of solar luminosity. If the number of the solar cells to be measured is too large, the loading of the users will be increased. As a result, the solar luminosity generating unit used in the present invention can be switched to the second simulated solar luminosity automatically to reduce the work load of the users switching manually after a certain period of time of simulated solar luminosity is provided, such as 5 seconds or 10 seconds, until the first current value and the first voltage value are constant. Furthermore, when the second current value and the second voltage value are constant, the solar luminosity generating unit will switch off automatically until being driven again the next time so as to save unnecessary electricity consumption.

Figure 4:
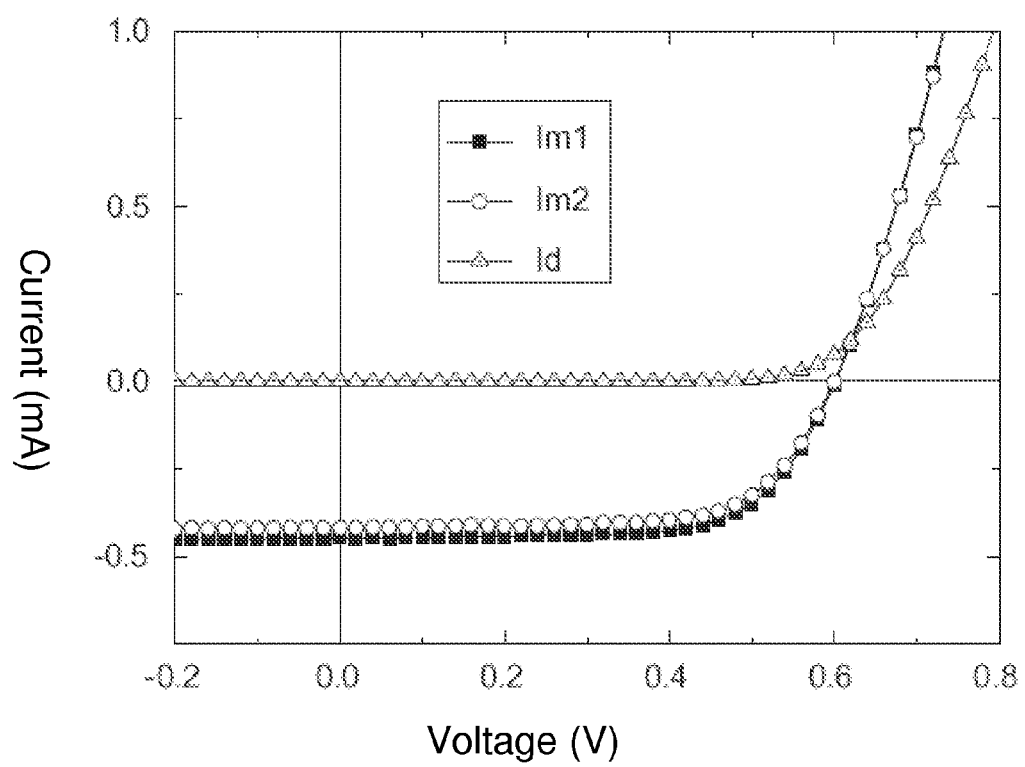
FIG. 4 is the I-V curves of the solar cell gained by the measuring means of the present invention.

FIG. 4 illustrates the I-V curve gained from a solar cell through the measuring method of the present invention. As illustrated, Id is the I-V curve of a solar cell in a dark place, and $I_{m1}$ and $I_{m2}$ are the I-V curves when the solar cell is illuminated by solar luminosities of different intensities. The measuring method for a solar cell of the present invention is to apply simulated luminosity with different intensities and measure a plurality of current values and voltage values gained from a solar cell when illuminated by solar luminosity with different intensities individually. Finally, the series resistance of the solar cell is gained through the plurality of current values and voltage values and the equations above; moreover, the I-V curve is completed using the actual measured values. Hence, the I-V curves do not need to be presumed, and the accurate values of all kinds of parameters of a solar cell can be gained through calculation, and it can be applied to all kinds of solar cells.

Figure 5A:
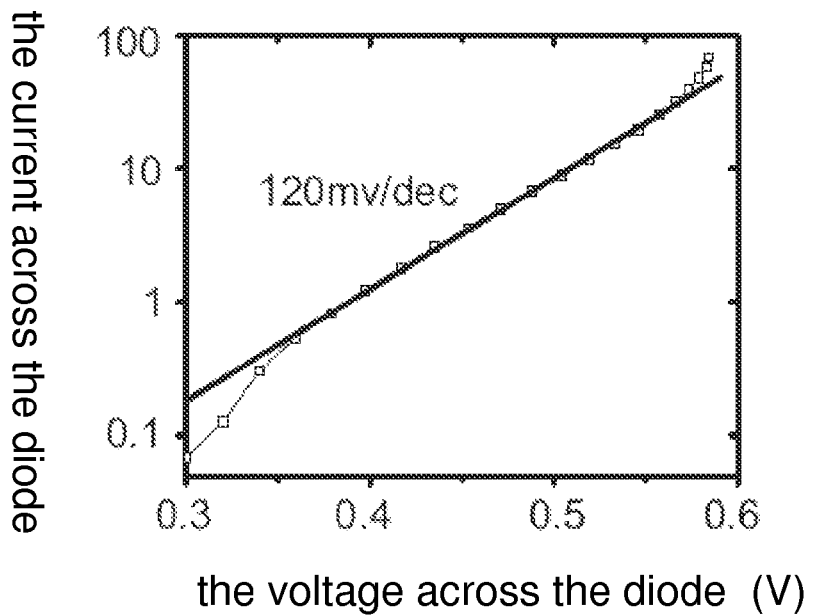
FIG. 5(a) illustrates the I-V curve of the multi-crystal silicon diode.
Figure 5B:
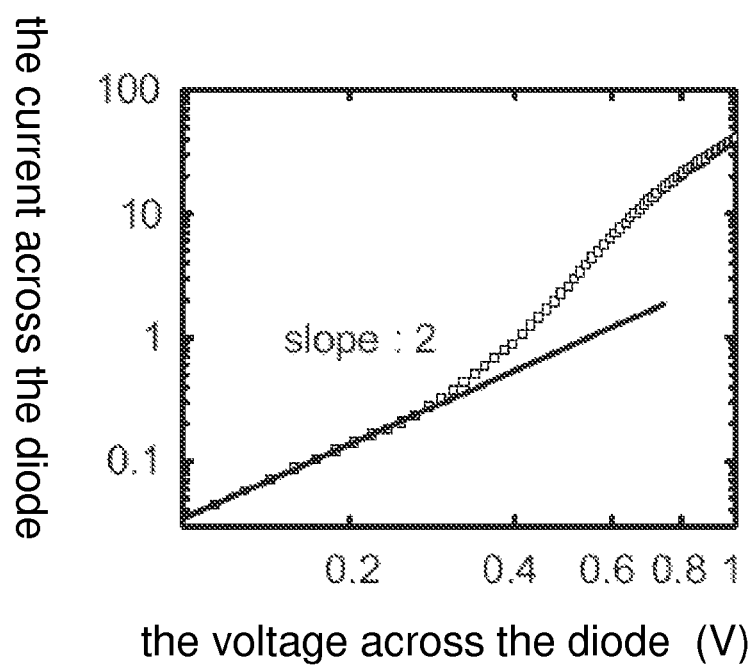
FIG. 5(b) illustrates the I-V curve of the amorphous silicon diode.

FIG. 5(a) illustrates the I-V characteristics of a multi-crystal diode. First gain the series resistance from the equation and two luminosities, and then use the gained series resistance to further gain the I-V characteristic figure of diode of FIG. 2. Obviously, 120 Mv/dec can prove that multi-crystal Silicon diodes have the defective current dominant phenomena. Besides, FIG. 5(b) is the I-V characteristic figure of amorphous silicon. Same as above, the series resistance is first gained from the equation and two luminosities, and then the gained series resistance is used to further gain the I-V characteristic figure of diode of FIG. 2. Clearly, slope 2 can prove that amorphous diode has the phenomena of SCL current. Because of the occurrences of the two phenomena, it is proved that the series resistance gained by the teacher is functional. With the two phenomena, the defective current dominant phenomena of the multi-crystal diode and the SCL current phenomena of the amorphous diode, it can be proved that the series resistance gained by the measuring method of the present invention is functional.

Although this invention is disclosed above with the preferred embodiments, the embodiments above do not intend to limit the present invention. Any person who is skilled in the art can make a little modification and revision without departing from the scope and spirit of the present invention. Therefore, the scope of the present invention is defined by the appended claims.

What is claimed is:

1. A process for extracting of solar cell parameters, including the following steps:
   (a) apply a first simulated solar luminosity having a first intensity to a solar cell;
   (b) measure a first current value and a first voltage value generated by the solar cell when the solar cell is illuminated by the first simulated solar luminosity;
   (c) apply a second simulated solar luminosity having a second intensity to the solar cell;
   (d) measure a second current value and a second voltage value generated by the solar cell when the solar cell is illuminated by the second simulated solar luminosity;
   (e) presume a series resistance, use a first calculation process to gain a total resistance, use a second calculation process, the series resistance, the first current value and the first voltage value to gain a first photocurrent value, and the values of a voltage across diode and a diode current can be gained by the first current value and the first voltage value;
   (f) a second photocurrent value can be gained in accordance with the second calculation process, the series resistance, the second current value and the second voltage value;
   (g) a voltage value and a current value can be gained in accordance with the series resistance, the total resistance, the second photocurrent value, the value of the voltage across diode and the diode current value;
   (h) measure a root mean square error (RMSE) between the voltage value and the current value, and the second voltage data and the second current data; and
   (i) if the value of the RMSE is larger than a certain value, then repeat from step (e) to step (h), if it's less than a certain value, then the second series resistance is the series resistance of the solar cell.

2. The method for extracting of solar cell parameters of claim 1, wherein the first calculation process of step (e) is:

$$I_m = \frac{1}{(R_{sh} + R_s)} \cdot V_m - \frac{R_{sh}}{(R_{sh} + R_s)} \cdot (f_0 + I_{ph})$$

in which, $I_m$ is the measured current, $R_s$ is the series resistance, $R_{sh}$ is the shunt resistance, $I_{ph}$ is the solar energy current, $f_0$ is the leakage current of the shunt resistance $R_{sh}$.

3. The method for extracting of solar cell parameters of claim 1, wherein the second computation equation of step (e) and (f) is: $I_{ph}=I_m(V_m=R_s \cdot I_m)$, in which $I_m$ is the measured current, $V_m$ is the measured voltage, $I_{ph}$ is the solar energy current, $R_s$ is the series resistance.

4. The method for extracting of solar cell parameters of claim 1, wherein the first intensity and the second intensity are different, so that the first current value and the second current value are different.

5. The method for extracting of solar cell parameters of claim 1, further including the step of isolating the solar cell from outside luminosity source before step (a).

6. The method for extracting of solar cell parameters of claim 1, further including the step of switching off the first simulated solar luminosity after step (b).

7. The method for extracting of solar cell parameters of claim 1, further including the step of switching off the second simulated solar luminosity after step (d).

8. The method for extracting of solar cell parameters of claim 1, wherein the first simulated solar luminosity and the second simulated solar luminosity are provided by the same solar luminosity and the solar luminosity generating unit will automatically switch to the second simulated solar luminosity after a certain period of time of providing the first solar luminosity.

9. The method for extracting of solar cell parameters of claim 8, wherein the certain period of time means the length of the time the simulated luminosity provided is long enough to make the first current value and the first voltage value constant.

10. The method for extracting of solar cell parameters of claim 8, wherein the solar luminosity generating unit will switch off automatically when the second current value and the second voltage value are constant.

* * * * *